United States Patent [19]
Jeng et al.

[11] Patent Number: 5,893,734
[45] Date of Patent: Apr. 13, 1999

[54] METHOD FOR FABRICATING CAPACITOR-UNDER-BIT LINE (CUB) DYNAMIC RANDOM ACCESS MEMORY (DRAM) USING TUNGSTEN LANDING PLUG CONTACTS

[75] Inventors: Erik S. Jeng, Hsinchu; Kwong Tsai, Jr., Chunghsung, both of Taiwan

[73] Assignee: Vanguard International Semiconductor Corporation, Hsin-Chu, Taiwan

[21] Appl. No.: 09/152,311

[22] Filed: Sep. 14, 1998

[51] Int. Cl.[6] ............................................. H01L 21/8242
[52] U.S. Cl. .................................... 438/239; 438/254
[58] Field of Search ............................ 438/238, 239, 438/253–256, 381, 396–399

[56] References Cited

U.S. PATENT DOCUMENTS

| | | | |
|---|---|---|---|
| 4,822,753 | 4/1989 | Pintchovski et al. | 437/192 |
| 5,045,899 | 9/1991 | Arimoto | 357/23.6 |
| 5,250,467 | 10/1993 | Somekh et al. | 437/192 |
| 5,281,549 | 1/1994 | Fazan et al. | 437/52 |
| 5,332,685 | 7/1994 | Park et al. | 437/52 |
| 5,648,291 | 7/1997 | Sung | 437/52 |
| 5,700,731 | 12/1997 | Lin et al. | 438/381 |

*Primary Examiner*—Joni Chang
*Attorney, Agent, or Firm*—George O. Saile; Stephen B. Ackerman

[57] ABSTRACT

DRAM devices are made having self-aligned tungsten landing plug contacts to gate electrodes for capacitor-under-bit line (CUB) for reduced aspect ratio contact openings. A planar insulating layer is formed, and openings for bit line contacts, node contacts, and contacts on the chip periphery are concurrently etched for metal landing plugs. A TiN/Ti/N+ polysilicon multilayer is deposited and annealed to form low contact resistance to the substrate. A tungsten (W) layer is then deposited and etched back to form W landing plug contacts in the contact openings, which reduce the aspect ratio for the multilevel contacts. A $Si_3N_4$ etch-stop layer and a BPSG are deposited and planarized. Capacitor openings are etched in the BPSG aligned over the node contacts. A conformal conducting layer and a planarized polymer are deposited and polished back to complete the bottom electrodes in the capacitor openings. After removing the polymer, an interelectrode dielectric layer and a conformal conducting layer (top electrode) are deposited and patterned to complete the capacitors. A planar insulating layer is formed and the interlevel contact openings etched with reduced aspect ratios to the landing plugs. W/TiN plugs are formed in the openings, and a first level of metal interconnections is formed.

29 Claims, 10 Drawing Sheets

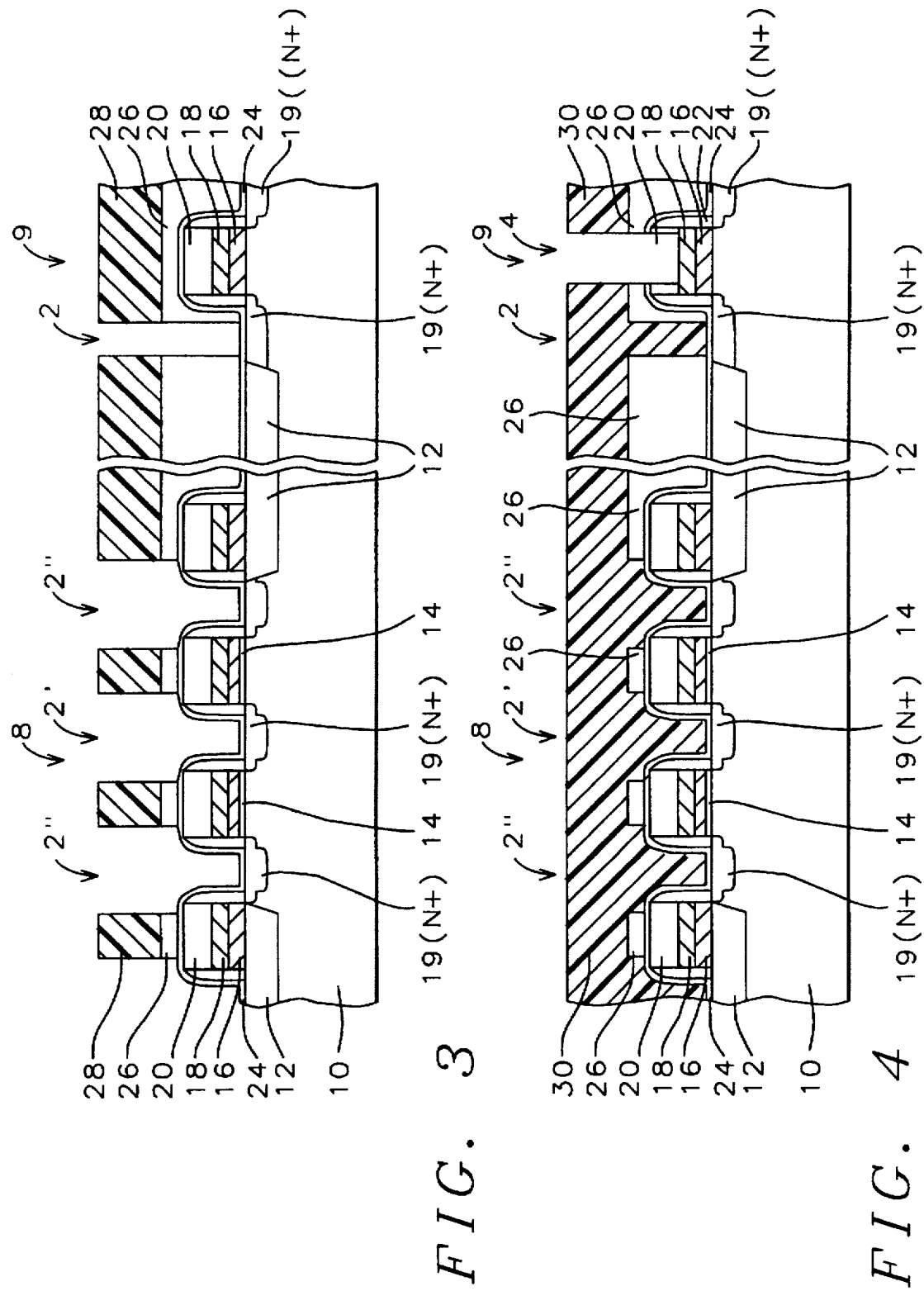

METHOD FOR FABRICATING CAPACITOR-UNDER-BIT LINE (CUB) DYNAMIC RANDOM ACCESS MEMORY (DRAM) USING TUNGSTEN LANDING PLUG CONTACTS

BACKGROUND OF THE INVENTION

(1) Field of the Invention

This invention relates to semiconductor integrated circuit devices, and more particularly to a method for fabricating dynamic random access memory (DRAM) devices with an array of memory cells having capacitor-under-bit line (CUB). At the same time the process integration forms tungsten landing plug contacts in the cell areas and peripheral areas of the DRAM chip that reduce the aspect ratio for the multilevel contacts The tungsten landing plug contacts include a unique barrier layer of TiN/Ti/N$^+$ polysilicon, that prevents dopant depletion from the substrate and forms titanium silicide (TiSi$_2$) contacts with lower contact resistance ($R_c$) to the substrate

(2) Description of the Prior Art

Dynamic random access memory (DRAM) circuits are used extensively in the electronics industry for storing data. Each memory cell consists of a single capacitor and a field effect transistor as a charge transfer transistor The binary data (1's and 0's) is stored as electrical charge on the capacitor in the individual memory cells. The number and density of these memory cells on the DRAM chip has dramatically increased in recent years and by the year 2000 the number of memory cells on a chip is expected to reach 1 Gigabit. This increase in circuit density has resulted from the downsizing of the individual semiconductor devices (FETs) and the resulting increase in device packing density The reduction in device size is due in part to advances in high-resolution photolithography and directional (anisotropic) plasma etching. However, as the horizontal device feature sizes are scaled down to submicrometer dimensions, it is necessary to use self-alignment techniques to relax the alignment requirements and improve critical dimension (CD) control.

Unfortunately, as the horizontal dimensions continue to decrease, while the vertical dimensions remain essentially constant, the aspect ratio (depth to width) increases and it becomes increasing difficult to etch reliable contact holes This is a particular problem when etching the multilevel contact openings on the DRAM devices. One method for reducing the difficulties of etching high aspect ratio contact holes on DRAMs is described in U.S. Pat. No. 5,332,685 to Park et al. In this approach a polysilicon or metal is formed by selective deposition or by deposition and etching back to form contact plugs in the contact holes in the insulating layer on the substrate. Park et al. then form the stacked capacitors and bit lines on the contact plugs adjacent to each other. However, since the capacitors and bit lines lie in the same plane, the size of the capacitor and packing density are limited. Another method for making DRAM memory cells is the Capacitor-Under-Bit line (CUB) structure described in U.S. Pat. No. 5,648,291 to Sung in which the bit line contact is made self-aligned to the adjacent stacked capacitor. However, the method requires a high-aspect-ratio contact hole for the bit line, which is increasingly difficult to make as the minimum feature sizes decrease. Still another method for making DRAMs is described in U.S. Pat. No. 5,045,899 to Arimoto. The bit line contact and bit line are formed between and adjacent to the stacked capacitors so as to suppress the stray bit line capacitance for improved circuit performance The problem of making multilevel contact holes with high aspect ratios is not addressed. Therefore, there is still a need to improve the DRAM process so as to minimize the aspect ratios of the multilevel contacts holes on the DRAM chip during downscaling of the minimum feature sizes of the devices.

Another problem associated with increased packing density is the increased contact resistance ($R_c$) with reduced minimum feature size of the contact hole and the formation of shallower diffused junction depths in the FET source/drain contact areas to improve the FET electrical characteristics. One approach is to replace the more conventional doped polysilicon plugs with tungsten (W) metal plugs using a titanium/titanium nitride (Ti/TiN) barrier/adhesion layer.

This approach is described by Somekh et al. in U.S. Pat. No. 5,250,467, in which a Ti barrier layer is deposited in the contact holes using a conventional PVD sputtering process and annealed in nitrogen to form a TiSi$_2$ with the doped silicon substrate contact and concurrently a top TiN layer. The W plug is then formed by CVD deposition using tungsten hexafluoride. However, Somekh et al. do not address the problem of depletion of the dopant from the substrate contact during TiSi$_2$ formation that would also increase the contact resistance ($R_c$). Another method of making W/TiN contacts is described by Pinchovski et al., U.S. Pat. No. 4,822,753, in which a self-aligned titanium silicide (salicide) is used, and then a TiN layer is deposited as a barrier/adhesion layer. However, the depletion of dopant from the shallow diffused junction in the substrate contact during the TiSi$_2$ formation is not addressed.

Therefore there is still a need in the semiconductor industry to provide a very manufacturable cost-effective process that increases the memory cell density on the DRAM chip while reducing the aspect ratio of the multilevel contact and reducing contact resistance ($R_c$).

SUMMARY OF THE INVENTION

It is a principal object of the present invention to form an array of closely spaced dynamic random access memory (DRAM) cells having capacitor-under-bit line (CUB) structures with tungsten (W) landing plug contacts.

It is another object of the present invention to concurrently form these landing plug contacts in the memory cell area and in the peripheral area of the DRAM chip to reduce the aspect ratios of the multilevel contacts in both areas of the DRAM chip.

Still another object of this invention is to form a barrier layer of TiN/Ti/N$^+$ polysilicon prior to forming the tungsten landing plug contacts that prevents depletion of the dopant from the substrate into the contacts during annealing, thereby preventing increased contact resistance ($R_c$).

In this invention a method is described for making an array of dynamic random access memory (DRAM) cells having landing plug contacts for bit line contacts capacitor node contacts, and the multilevel contacts on the periphery of the DRAM chip, which reduces the aspect ratios of the contact openings in the cell area and the peripheral area of the DRAM chip The method also includes an N$^+$ doped polysilicon layer as part of a barrier layer at the landing plug contacts/substrate interface that improves contact resistance in the cell areas compared to the more conventional polysilicon plug processes The method begins by providing a semiconductor substrate. Typically the substrate is a P$^-$ doped single-crystal silicon having a <100> crystallographic orientation Device areas for the DRAM memory cells and for peripheral devices on the substrate are surrounded and electrically isolated by a relatively thick Field OXide (FOX). One conventional method of forming the FOX areas is by a shallow trench isolation (STI) method, as commonly practiced in the industry The FETs are formed next. A thin gate oxide is formed on the device areas Then a multilayer of a heavily N⁺ doped polysilicon layer and a refractory metal silicide layer (polycide), and a silicon oxide/silicon nitride ($SiO_2/Si_3N_4$) layer is deposited and patterned to form the FET gate electrodes having a cap oxide. Concurrently the patterned polycide forms the word lines over the field oxide areas. For these submicrometer FET structures, lightly doped source/drain areas are formed adjacent to the gate electrodes, and insulating sidewall spacers are formed next on the FET gate electrodes to reduce short-channel effects and to improve the device electrical characteristics. Additionally source/drain contact areas can be formed by ion implanting an N type dopant, such as phosphorus ions ($p^{31}$), adjacent to the sidewall spacers on the FET gate electrodes. This completes the array of FETs used to form the array of switching transistors in the DRAM cells. By including additional processing steps that include both P and N wells in the silicon substrate, both N-channel and P-channel FETs can be formed to provide Complementary Metal Oxide Semiconductor (CMOS) circuits in and on the periphery of the DRAM chip.

The low-contact-resistance tungsten landing plug contacts are formed next. A relatively thin conformal silicon nitride layer is deposited. A relatively thick first insulating layer, composed of a borophosphosilicate glass (BPSG), is deposited and chemically/mechanically polished to provide a planarized surface. A first photoresist mask and anisotropic etching are then used to selectively etch contact openings in the first insulating layer and the silicon nitride layer to the source/drain contact areas of the memory cells to form self-aligned bit-line and capacitor-node contact openings, and also to form contact openings to the substrate in the peripheral device areas. After removing the first photoresist mask, a second photoresist mask and anisotropic etching are used to etch contact openings in the first insulating layer and the silicon nitride layer to the patterned polycide layer in the peripheral device areas, while the second photoresist mask protects the memory cell areas from etching. The second photoresist mask is removed. A key feature of this invention, a heavily N⁺ doped polysilicon layer is deposited followed by the deposition of a barrier layer of titanium (Ti) and titanium nitride (TiN). The substrate is then annealed to form titanium silicide ($TiSi_2$) contacts in the contact openings, while the interposed N⁺ doped polysilicon prevents depletion of the substrate dopant during annealing by solid-state diffusion. This provides improved contact resistance (low contact resistance). A first conducting layer, such as tungsten (W), is deposited to a thickness sufficient to fill the contact openings. The W layer, the TiN layer, and the $TiSi_2$ layer are etched back to the first insulating layer to form the W landing plugs in the contact openings. An etch-stop layer, such as a silicon nitride ($Si_3N_4$), is deposited.

The stacked storage capacitors are now formed by depositing a relatively thick second insulating layers composed of $SiO_2$. A third photoresist mask and anisotropic plasma etching are used to form openings in the second insulating layer and the etch-stop layer for the capacitor bottom electrodes aligned over and etched to the landing plugs for the capacitor node contacts. The third photoresist mask is removed, and a conformal second conducting layer, composed of tungsten or titanium nitride, is deposited on the substrate and in the openings for the capacitor bottom electrodes. A third insulating layers composed of silicon oxide or a polymers is deposited to fill the capacitor openings and to form a planar surface. The oxide or polymer is blanket etched back to the second conducting layer on the top surface of the second insulating layers while portions remain in the capacitor openings to prevent etching of the second conducting layer in the openings for the bottom electrodes. The exposed second conducting layer on the top surface of the second insulating layer is etched back to complete the array of capacitor bottom electrodes for the DRAM. The oxide or polymer is then removed, for example by a wet etch or plasma ashing, respectively. A hydrofluoric (HF) acid etch is used to remove the remaining second insulating layer down to the $Si_3N_4$ etch-stop layer to leave freestanding capacitor bottom electrodes The polymer is then removed by oxygen ashing. A capacitor interelectrode dielectric layer is then formed on the bottom electrodes, and a third conducting layers such as titanium nitride, tungsten, or the like, is deposited and patterned to form the capacitor top electrodes. A fourth insulating layer is deposited sufficiently thick to protect the capacitor bottom electrodes and is polished back to form a planar surface Continuing with the process, the multilevel contacts having reduced aspect ratios are then formed. The next level of electrical interconnections is formed by etching the multilevel contact openings or via holes in the fourth insulating layer. A photoresist mask and anisotropic plasma etching are used to etch the multilevel contact openings to the capacitor top electrodes, while concurrently etching multilevel contact openings in the fourth insulating layer and the etch-stop layer to the landing plug contacts (tungsten plugs) on the substrate, and to the patterned polycide layer in the peripheral device areas. At the same time, the bit line contact openings are also etched to the landing plug contacts over the source/drain bit line contact areas in the cell areas. By the method of this invention, the multilevel contact openings etched to the landing plug contacts result in shallower contact openings and therefore reduce the aspect ratios. This improves the reliability of making contacts on high-density circuits having submicron dimensions To complete the integrated circuit (DRAM) to the first level of electrical interconnections, a fourth conducting layer, such as Ti/TiN and W, is deposited and etched back to form conducting plugs in the multilevel contact openings A first metal layer, such as Ti-TiN/AlCu/TiN, is then deposited and patterned by conventional means to complete the first level of electrical interconnections, including the bit lines The process for forming the first level of electrical interconnections can be repeated to form additional levels of interconnections to complete the wiring on the DRAM chip

BRIEF DESCRIPTION OF THE DRAWINGS

The objects and advantages of this invention are best understood with reference to the attached drawings in the figures and the embodiment that follows.

FIGS. 1 through 13 are schematic cross-sectional views showing the sequence of process steps for making the novel capacitor-under-bit line (CUB) DRAM device having multilevel contact openings with reduced aspect ratios on the cell area and the peripheral area of the DRAM chip.

DESCRIPTION OF THE PREFERRED EMBODIMENT

Referring now to FIGS. 1 through 13 and in keeping with the objects of this inventions a detailed embodiment is described for making CUB-DRAM devices having multilevel contacts with reduced aspect ratios. Tungsten (W) landing plugs are used to achieve these reduced aspect ratios An additional novel feature is to include a conductively doped polysilicon layer in the barrier layer for the landing plugs to reduce contact resistance Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P-doped substrates P-channel FETs can also be provided from which Complementary Metal-Oxide-Semiconductor (CMOS) circuits can be formed, such as are required for the peripheral circuits on the DRAM chip.

Figure 1:
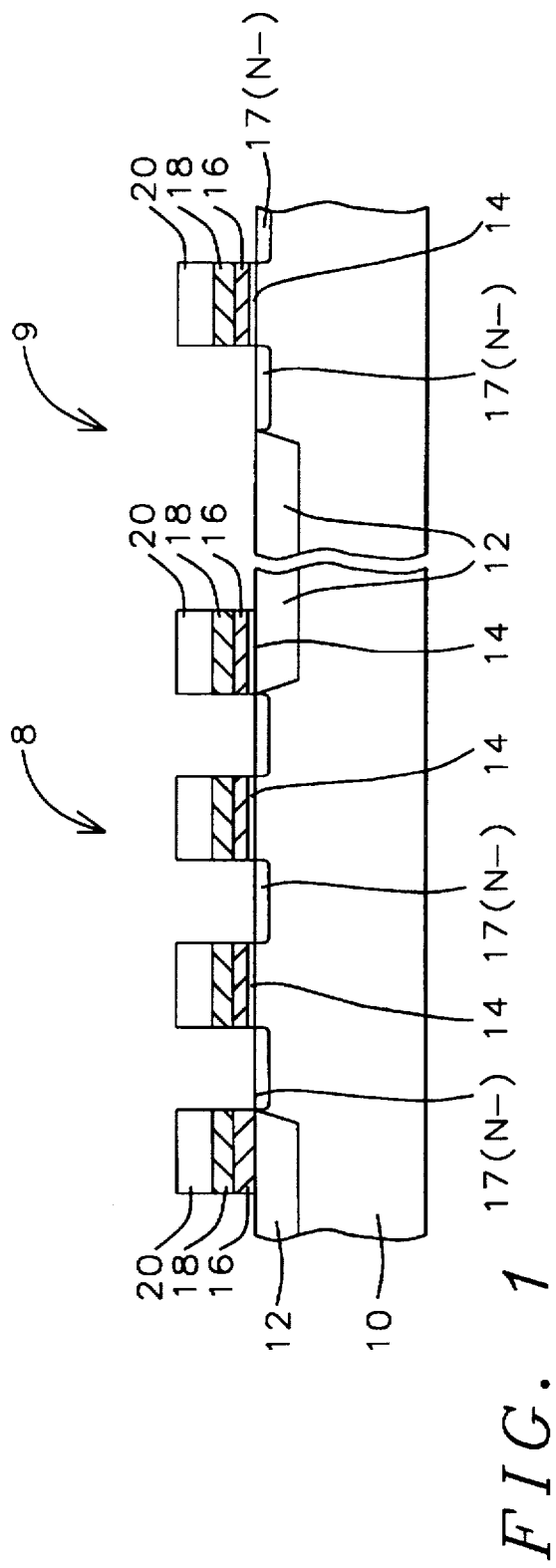

Referring to FIG. 1, the method begins by providing a semiconductor substrate 10, a portion of which is shown in the Figs., having memory cell regions 8 and peripheral regions 9. Typically the substrate is a P⁻ doped single-crystal silicon having a <100> crystallographic orientation Field OXide (FOX) regions 12 are formed surrounding and electrically isolating the device areas Portions of the FOX 12 are depicted in the Figs. for one of the memory cell areas. One conventional method of forming the field oxide regions is by using a shallow trench isolation (STI) method, as commonly practiced in the industry. Generally the STI is formed by etching trenches in the field oxide regions on the substrate to a depth of between about 2000 and 4000 Angstroms. After forming a thin thermal oxide in the trenches, the trenches are filled with an insulating material such as silicon oxide ($SiO_2$), and are made planar with the surface of the substrate 10, for example, by using a planarizing etch-back or chemical/mechanical polishing (CMP). Next, a thin gate oxide 14 of about 40 to 90 Angstroms is grown on the device areas The FET gate electrodes are then formed by depositing an N⁺ doped polysilicon layer 16, for example by low pressure chemical vapor deposition (LPCVD), and is typically deposited to a thickness of between about 500 and 1500 Angstroms. Layer 16 is doped with arsenic (As) or phosphorus (P) to a concentration of between about 1.0 E 20 and 1.0 E 21 atoms/cm³. A refractory metal silicide layer 18 preferably composed of tungsten silicide ($WSi_2$) is deposited by LPCVD, using tungsten hexafluoride ($WF_6$), to a thickness of between about 500 and 1500 Angstroms. A cap oxide layer 20, composed of $SiO_2$ with a top $Si_3N_4$ layer, is deposited Layer 20 is deposited preferably by LPCVD and has a thickness of between about 1000 and 2500 Angstroms. Layers 20, 18, and 16 are patterned using conventional photolithographic techniques and anisotropic plasma etching to form the polycide gate electrodes over the active device areas 8, while forming word lines over the FOX 12, and concurrently forming portions of the FETs in the chip area 9 for the peripheral circuits Lightly doped source/drain areas 17(N⁻) are then formed by ion implanting phosphorus ions ($p^{31}$) adjacent to the gate electrodes to minimize the short-channel effect for these submicron FET structures.

Figure 2:
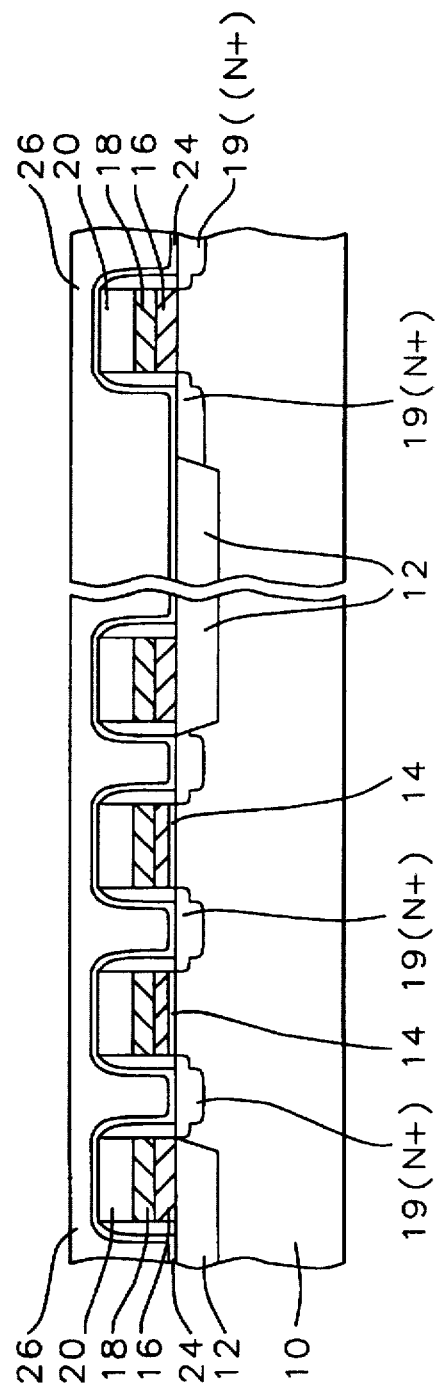

Referring now to FIG. 2, insulating sidewall spacers 22 are formed on the sidewalls of the gate electrodes (16,18). The sidewall spacers 22 are formed preferably by depositing a conformal $Si_3N_4$ layer using LPCVD, and anisotropically plasma etching back the $Si_3N_4$ layer. The $Si_3N_4$ is deposited to a preferred thickness of between about 200 and 800 Angstroms prior to etching Source/drain contact areas 19(N⁺) are now formed by ion implanting an N type dopant, such as $p^{31}$, adjacent to the sidewall spacers 22 on the sidewalls of the FET gate electrodes to complete the FETs. The contacts 19(N⁺) are preferably doped to a final concentration of between about 1.0 E 19 and 1.0 E 21 atoms/cm³.

Still referring to FIG. 2, a relatively thin conformal $Si_3N_4$ layer 24 is deposited by LPCVD using a reactant gas mixture such as dichlorosilane ($SiCl_2H_2$) and ammonia ($NH_3$). Layer 24 is deposited to a preferred thickness of between about 50 and 400 Angstroms. A relatively thick first insulating layer 26 is deposited on the $Si_3N_4$ layer 24 0 Layer 26 is preferably composed of a borophosphosilicate glass (BPSG), which can be deposited by LPCVD using tetraethosiloxane (TEOS) as the reactant gas. Boron and phosphorus are added during deposition of the BPSG layer. Layer 26 is then chemically/mechanically polished to provide a planarized surface having a thickness of between about 4500 and 9000 Angstroms over the gate electrodes.

Referring now to FIG. 3, a first photoresist mask 28 and anisotropic etching are used to selectively etch self-aligned contact openings 2, 2', and 2" in the first insulating layer 26 to the $Si_3N_4$ layer 24 over the source/drain contact areas 19(N⁺) in the memory cell area 8, and to form contact openings 2 to the substrate 10 in the peripheral area 9, while the photoresist protects device areas elsewhere on the chip. The plasma etching is preferably carried out using reactive ion etching (RIE) and an etchant gas mixture such as perfluoroisobutylene ($C_4F_8$), trifluoromethane ($CHF_3$) methylfluoride ($CH_3F$), carbon tetrafluoride ($CF_4$), carbon monoxide (CO), oxygen ($O_2$), and argon (Ar) as the carrier gas, and provides an etch-rate selectivity of BPSG to $Si_3H_4$ of at least greater than 20:1. This results in the contact openings 2 being etched concurrently to form the bit line contact openings 2' and capacitor node contact openings 2" self-aligned to the gate electrodes, as shown in FIG. 3. The first photoresist mask 28 is then removed, for example by plasma ashing in oxygen ($O_2$)

Referring to FIG. 4, after removing the first photoresist mask, a second photoresist mask 30 and anisotropic plasma etching are used to etch contact openings 4 in the first insulating layer 26, the $Si_3N_4$ 24, and also through the cap oxide layer 20 to the top surface of the patterned polycide layer, composed of layers 18 and 16, in the peripheral device area 9. The second photoresist mask 30 protects the memory cell areas 8 during the etching Preferably the anisotropic etching is carried out in a reactive ion etcher having a high etch-rate selectivity of at least 5:1 of the BPSG layer 26 to the $WSi_2$ layer 18.

Figure 5:
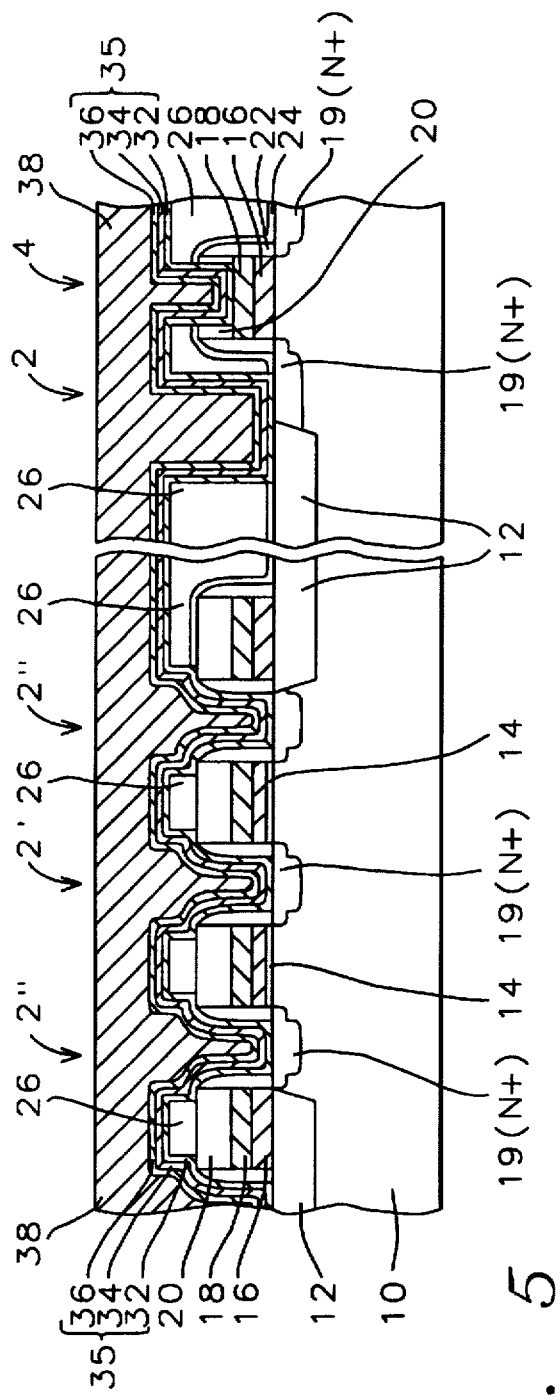
Figure 6:
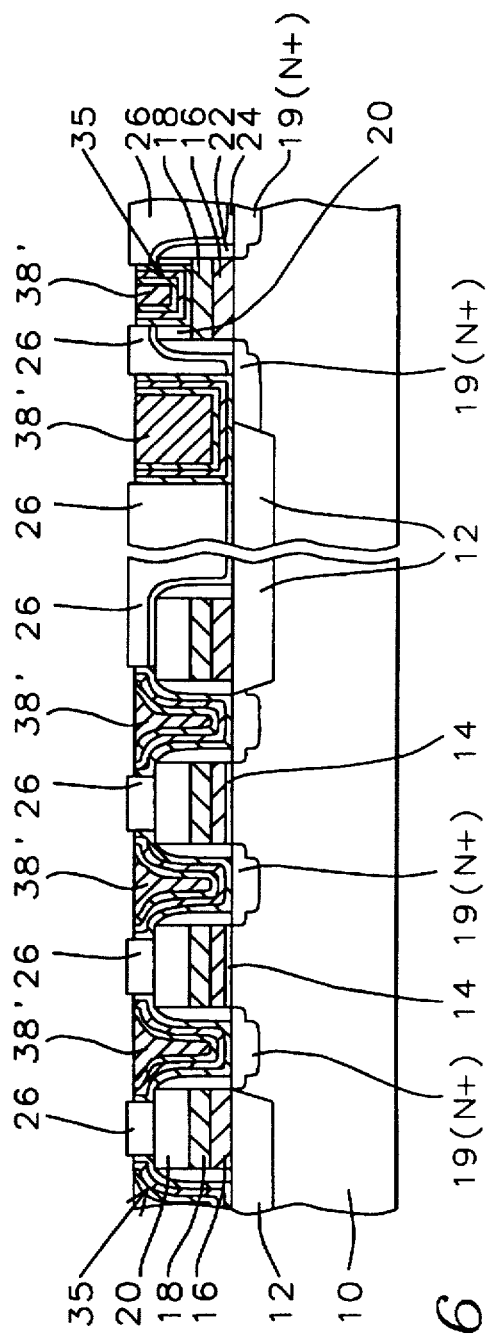
Figure 7:
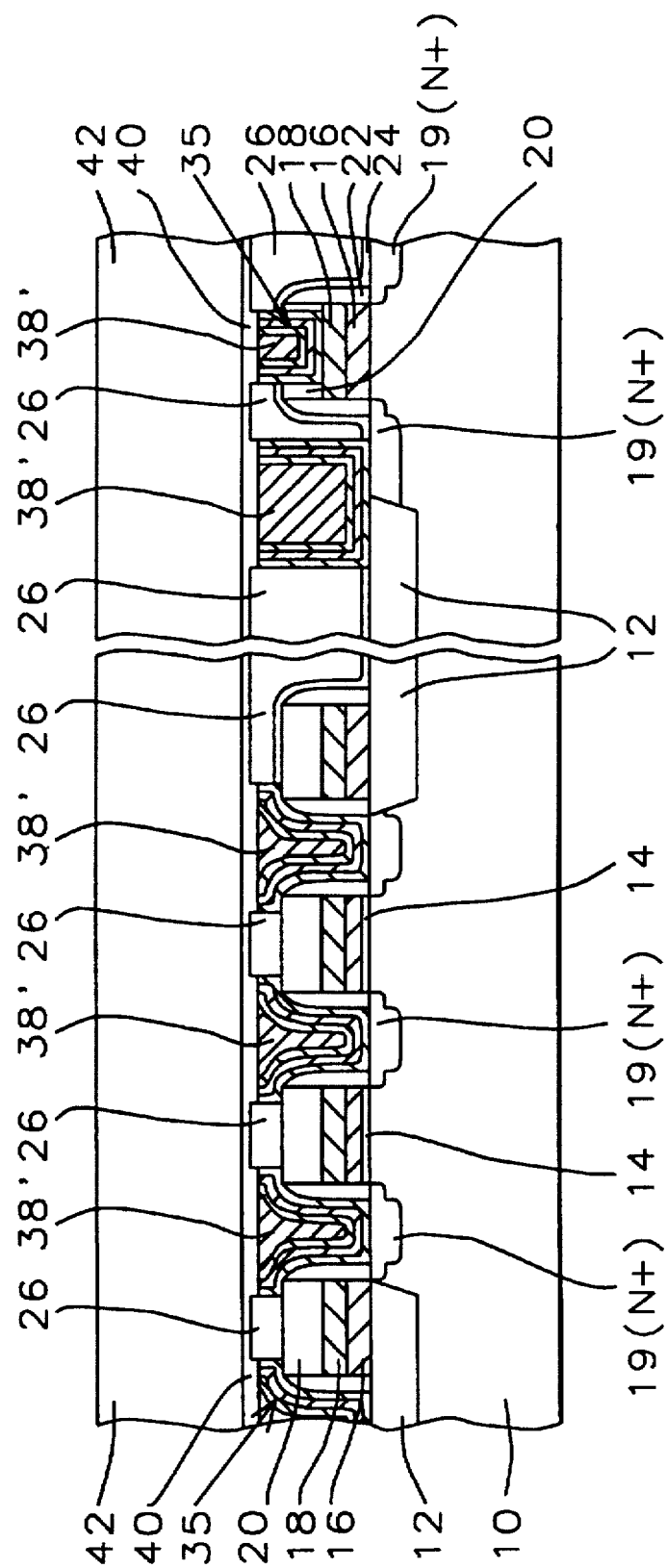
Figure 8:
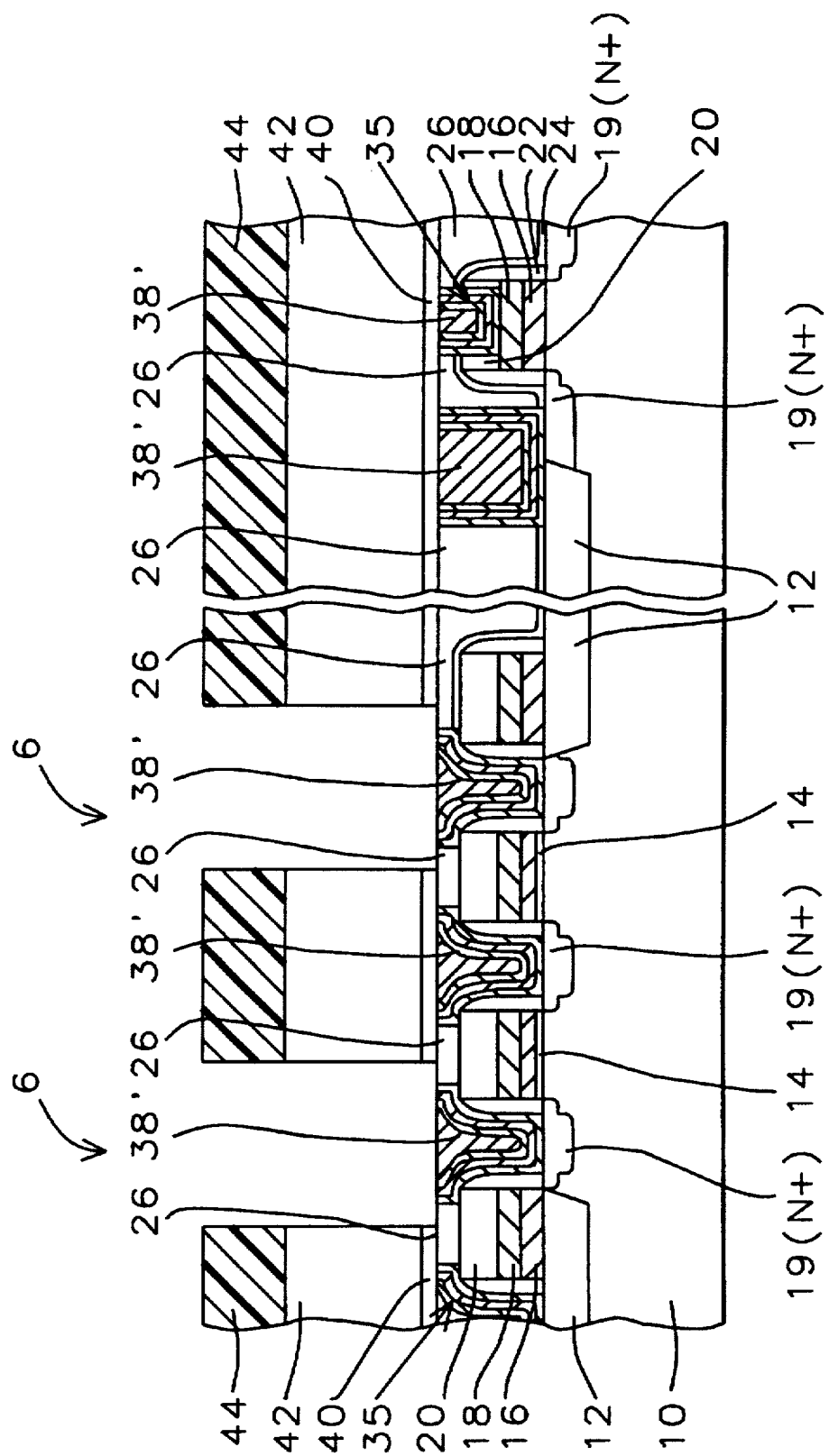

Referring to FIG. 5, after etching the contact openings 4 for the peripheral landing plugs, the second photoresist mask is removed. The $Si_3N$ layer 24 is removed over the source/drain contact areas 19(N⁺) in the exposed contact openings 2, 2', and 2". Continuing with the process and a key feature of the invention, a conformal conductively doped polysilicon layer 32 is deposited. Preferably layer 32 is deposited by LPCVD using silane ($SiH_4$) as the reactant gas, and the polysilicon is deposited to a thickness of between about 100 and 300 Angstroms. Layer 32 is then doped preferably by ion implantation using $P^{31}$ ions to a concentration of between about 1.0 E 19 and 1.0 E 20 atoms/cm³. To prevent implanting in the contacts for the P channel FETs, a photoresist block-out mask can be employed during the $P^{31}$ implant, and alternatively a block-out mask can be used over the N channel FET contacts when implanting the P dopant, such as boron (B), in the P channel FET contacts. Then a conformal metal barrier layer, composed of a titanium (Ti) layer 34 and a titanium nitride (TiN) layer 36, is formed. For example, the Ti layer 34 can be deposited by CVD using a reactant gas such as $TiCl_4$. Layer 34 is deposited to a preferred thickness of between about 50 and 200 Angstroms. Next, a TiN layer 36 is formed by CVD using a reactant gas mixture such as $TiCl_4$ and ammonia ($NH_3$). Layer 36 is deposited to a thickness of between about 100 and 300 Angstroms.

After forming the barrier layer, the substrate is annealed to form $TiSi_2$ 35 using the Ti layer 34 and the polysilicon layer 32. Preferably the annealing is carried out in an oxygen-free ambient at a temperature of between about 500 and 700° C. for a time sufficient to form $TiSi_2$, and more particularly for about 1 to 30 minutes Another method of forming the $TiSi_2$ 35 is by rapid thermal anneal (RTA). Since the polysilicon is $N^+$ doped, it prevents outdiffusion and depletion of the N dopant from the silicon substrate 10, which prevents high contact resistance ($R_c$). Alternatively, the process step for depositing the TiN can be eliminated and the TiN can be formed during annealing, by annealing in a nitrogen ($N_2$) or an $NH_3$ ambient.

Still referring to FIG. 5, a tungsten layer 38 is formed by CVD using tungsten hexafluoride ($WF_6$) as the reactant gas. Layer 38 is deposited to a thickness sufficient to fill the contact openings 2, 2', 2", and 4, and more specifically to a thickness of at least greater than 1000 Angstroms Referring to FIG. 6, the tungsten layer 38, the TiN layer 36, and the $TiSi_2$ layer formed from layers 34 and 32 are then etched back to the first insulating layer 26 thereby forming conducting plugs 38' composed of tungsten with a barrier layer of $TiN/TiSi_2$. Alternatively layers 38, 36, and the $TiSi_2$ formed from layers 34 and 32 can be chemically/mechanically polished back. The conducting plugs 38' serve as landing plug contacts for the multilevel contact openings that are formed later. This reduces the aspect ratio for making the multilevel contacts, and since all of the contact plugs are made at the same times this reduces the possible risk of substrate damage that would otherwise occur during different contact etchings Referring to FIG. 7, an etch-stop layer 40 is deposited, and a thick second insulating 42 is deposited The etch-stop layer 40 is preferably composed of a silicon oxynitride (SiON) layer or a silicon nitride layer and is deposited over the landing plug contacts 38'. Layer 40 is deposited by LPCVD using, for examples dichlorosilane ($SiCl_2H_2$) and ammonia ($NH_3$), and is deposited to a thickness of between about 100 and 500 Angstroms. Layer 42 is preferably composed of a silicon oxide or a BPSG and is deposited to a thickness of between about 10000 and 20000 Angstroms. The $SiO_2$ layer 42 is deposited by LPCVD using TEOS as the reactant gas, and if a BPSG is used, appropriate dopant gases, such as boron and phosphorus, can be added during deposition Referring to FIG. 8, a third photoresist mask 44 and anisotropic plasma etching are used to form openings 6 in the second insulating layer 42 and the etch-stop layer 40 for the capacitor bottom electrodes aligned over and to the landing plugs contacts 38' used as the capacitor node contacts, while the third photoresist mask protects from etching the second insulating layer 42 over the other W landing plug contacts. The openings 6 are etched preferably using RIE and an etchant gas such as $C_4F_8$, $CHF_3$, $CH_3F$, $CF_4$, CO, $O_2$, and Ar as the carrier gas.

Figure 9:
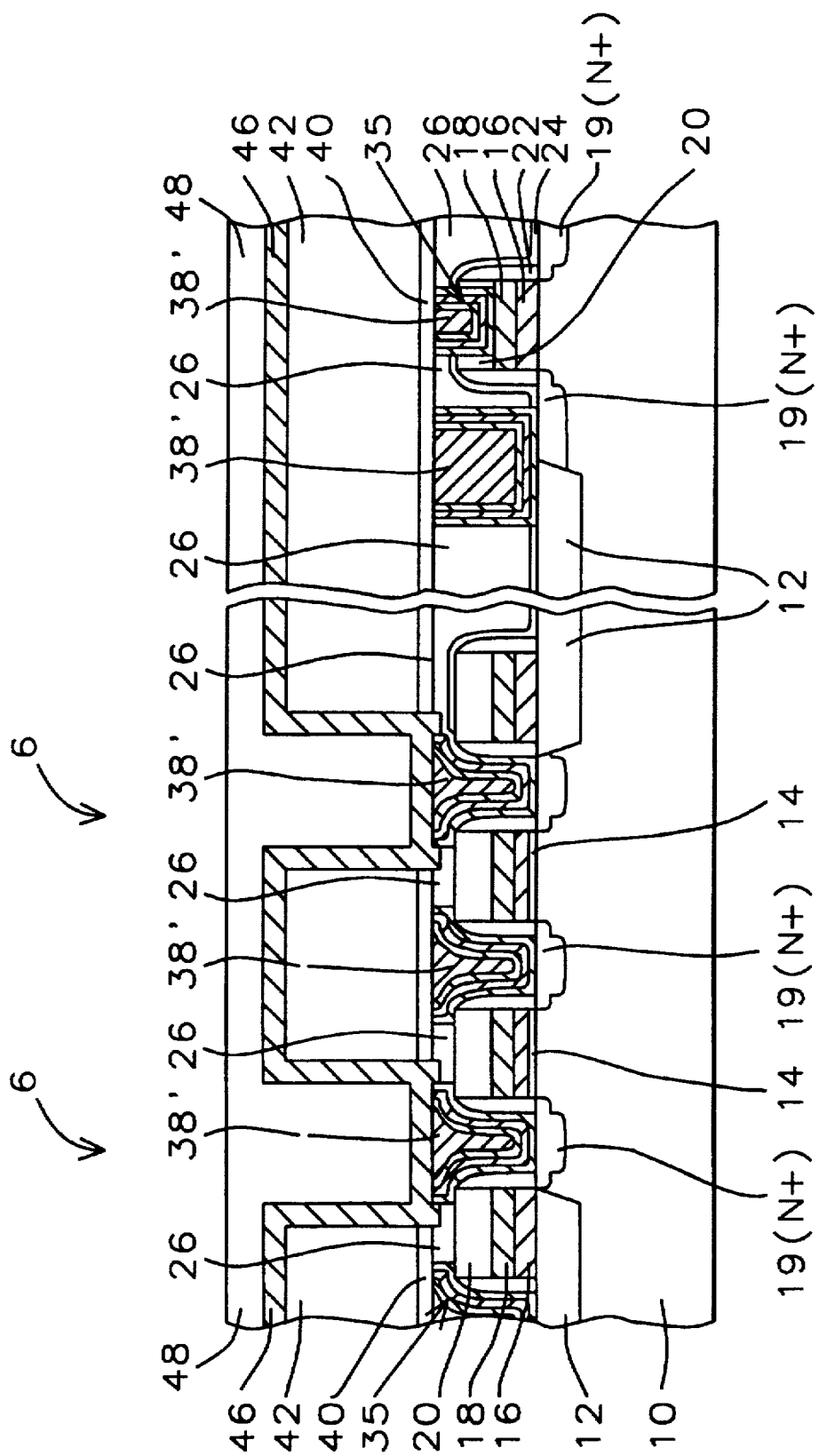

Referring now FIG. 9, the third photoresist mask 44 is removed by plasma ashing in $O_2$. A conformal second conducting layer 46 is deposited for forming the capacitor bottom electrodes. Layer 46 is preferably a tungsten layer, deposited by LPCVD using $WF_6$ as the reactant gas. The second conducting layer 46 is deposited to a thickness of between about 300 and 1000 Angstroms. Layer 46 can also be other electrically conducting materials such as TiN, which can be deposited by CVD using a reactant gas such as $TiCl_4$ and $NH_3$.

Still referring to FIG. 9, a third insulating layer 48 is deposited. Layer 48 is preferably a polymer deposited by spin coating to fill the capacitor openings 6 and to form a planar surface. Various polymers can be used, including photoresist and polyimide.

Figure 10:
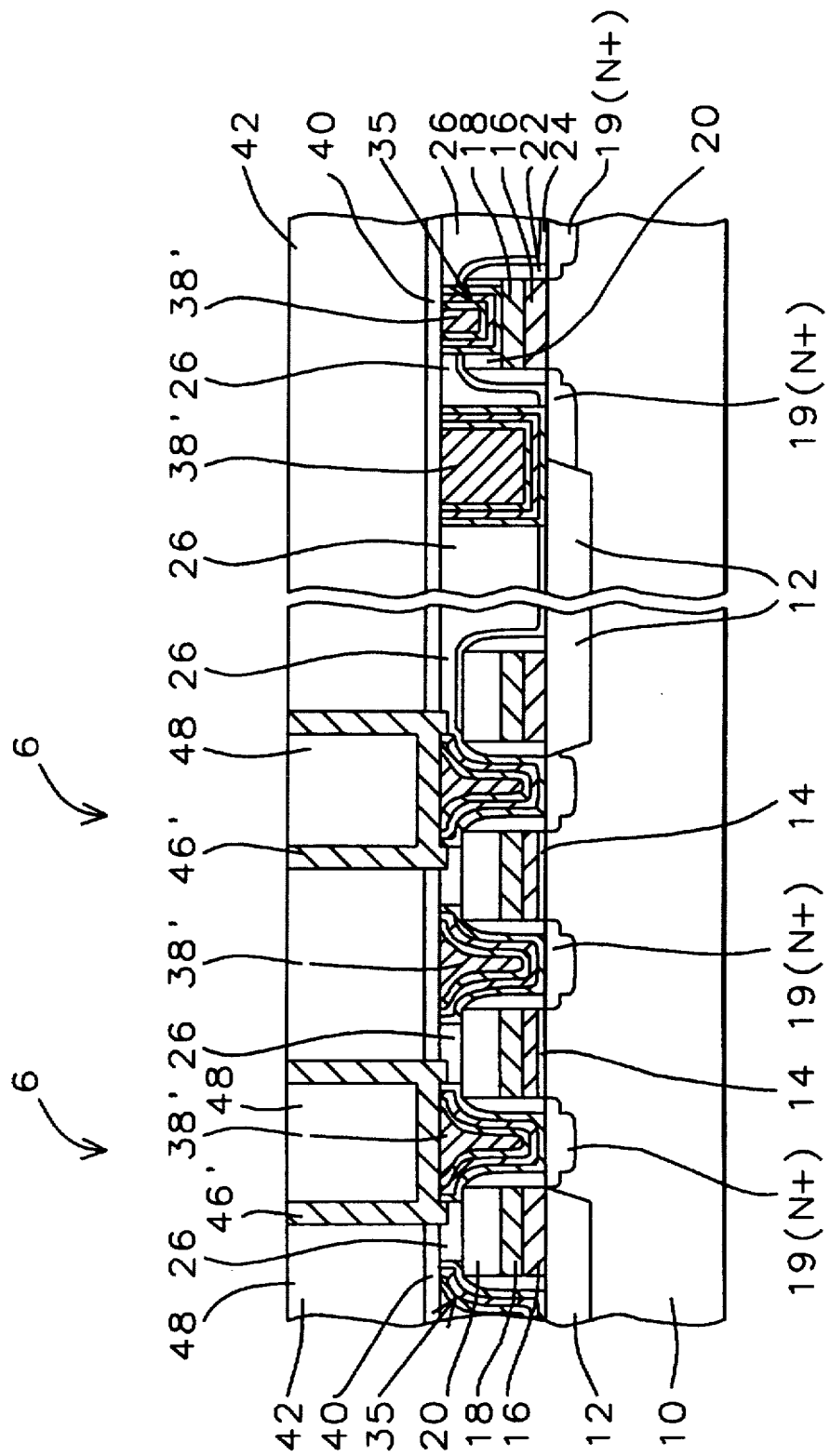

Referring to FIG. 10, the polymer 48 is blanket etched back to the second conducting layer 46 on the top surface of the second insulating layer 42, while leaving portions of the polymer 48 in the capacitor openings 6 to protect from etching the second conducting layer 46 in the openings 6 that provide the bottom electrodes for the capacitors. The polymer is preferably etched back using a plasma etching in oxygen. Also as shown in FIG. 10, the exposed second conducting layer 46 on the top surface of the second insulating layer 42 is etched back to complete the array of capacitor bottom electrodes 461 for the DRAM. Preferably the TiN or W layer 46 is etched using plasma etching in an etchant gas such as $Cl_2$, $BCl_3$, $SF_6$, $CF_4$, $O_2$, and Ar, or is chemically/mechanically polished back to form the capacitor bottom electrodes. Alternatively, a CVD oxide can be used in place of the polymer as the third insulating layer.

Figure 11:
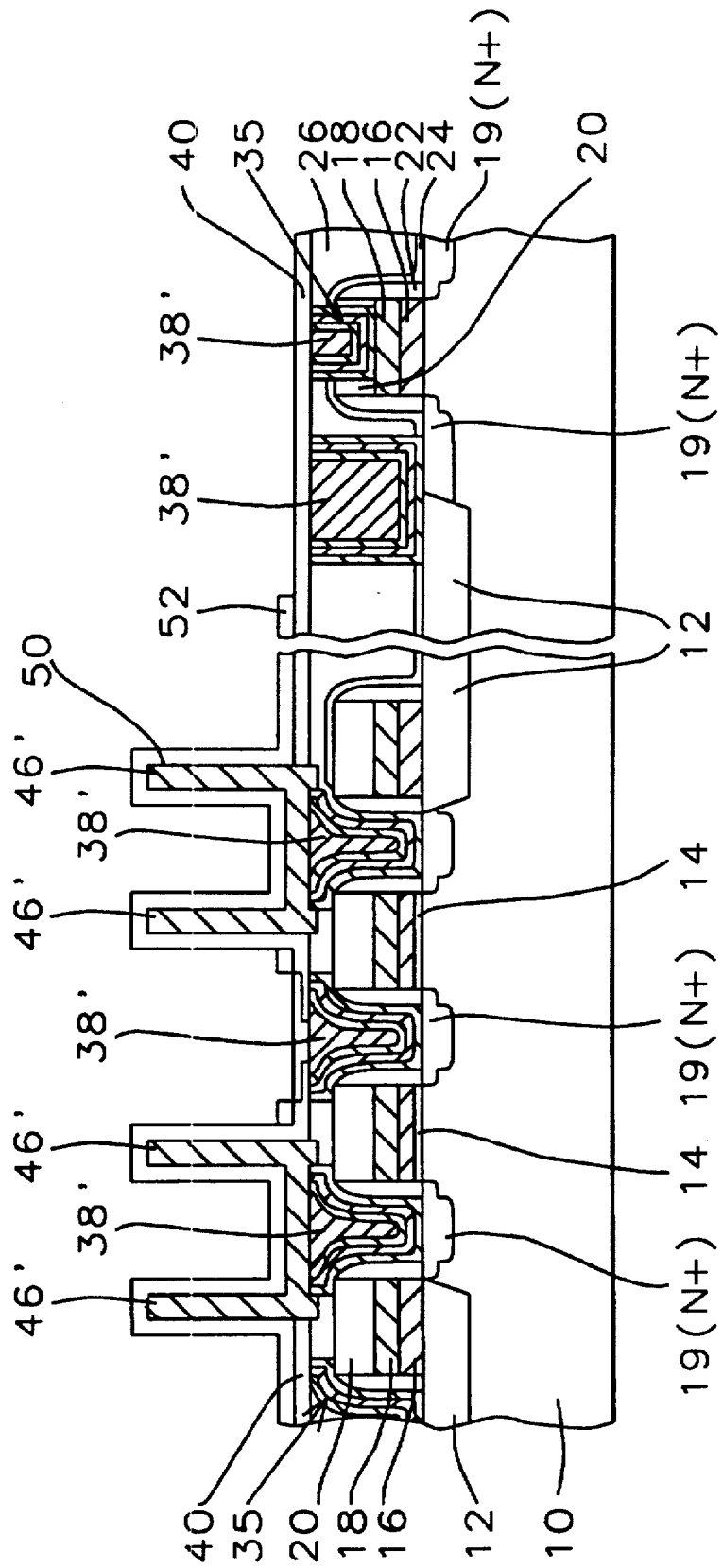

Referring to FIG. 11, the capacitors are now completed by the following sequence of steps. The remaining polymer 48 is removed, for example by plasma ashing in $O_2$. Next, the remaining second insulating layer 42 is selectively removed to the etch-stop layer 40 using a hydrofluoric acid etch. If layer 48 is a CVD oxide, then it is also removed concurrently during this HF etching step. A capacitor interelectrode dielectric layer 50 is then formed on the surface of the bottom electrodes 46', and is not depicted as a separate layer in FIG. 11. Preferably layer 50 is an insulator having a high dielectric constant. For example, when the bottom electrodes 46' are composed of tungsten or TiN, the interelectrode dielectric layer can be composed of one of the high-dielectric-constant layers, such as tantalum pentoxide ($Ta_2O_5$) or barium strontium titanium oxide ($(BaSr)TiO_3$, commonly referred to as BST. Preferably the thickness of layer 50 is between about 45 and 300 Angstroms.

Still referring to FIG. 11, the array of stacked capacitors is now completed by depositing a conformal third conducting layer 52, such as TiN, W, or the like. Preferably layer 52 is deposited to a thickness of between about 500 and 1500 Angstroms. Layer 52 is then patterned to form the capacitor top electrodes 52.

Figure 12:
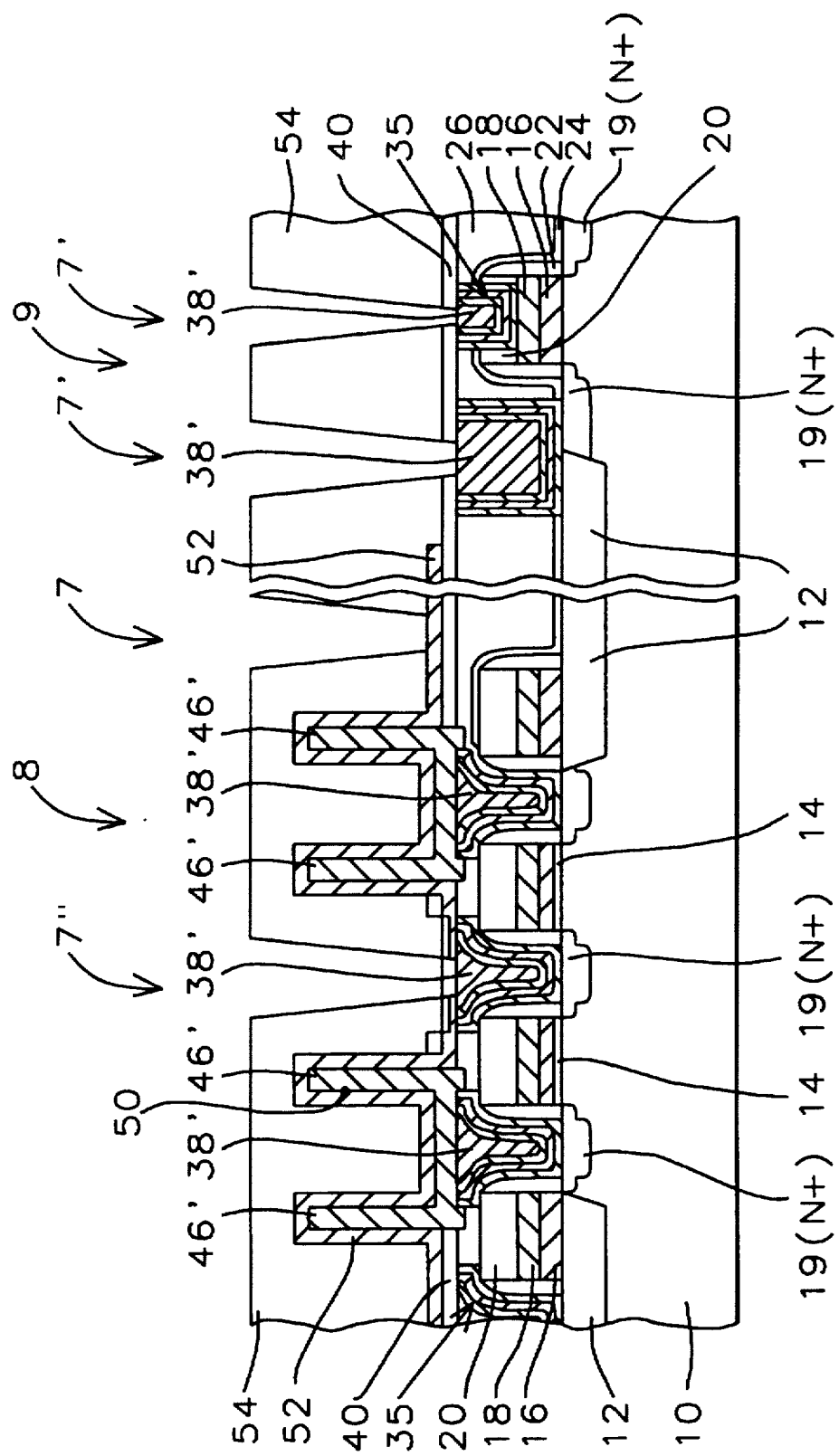

Referring now to FIG. 12, a fourth insulating layer 54 is deposited sufficiently thick to fill the capacitor openings 6 and more specifically to a thickness of between about 10000 and 20000 Angstroms. Layer 54 is then chemically/mechanically polished back to form a planar surface and to provide the insulation over the memory cell area 8 and the devices in the peripheral area 9 of the chip.

Referring still to FIG. 12, conventional photolithographic techniques and anisotropic plasma etching are used to etch contact openings 7 in the fourth insulating layer 54 to the capacitor top electrodes 52, while concurrently etching multilevel contact openings 7' in the fourth insulating layer 54 and the etch-stop layer 40 to the W landing plug contacts 38' on the substrate and to the landing plug contacts 38' on the patterned polycide layer (18,16) in the peripheral device area 9. The bit line contact openings 7" are also etched at the same time to the landing plug contacts 38' on the FET source/drain areas 19($N^+$) in the memory cell area 8 for bit line contacts The multilevel contact openings are preferably etched using anisotropic plasma etching having a high selective etch-rate ratio of $SiO_2$ to W or TiN. For example, the contact openings can be etched using an RIE and an etchant gas such as $C_4F_8$, $CHF_3$, $CH_3F$, $CF_4$, CO, $O_2$, and Ar, having an etch-rate ratio of $SiO_2$ to W or TiN of greater than 10:1. By the method of this invention, the multilevel contact openings are etched all at the same time to the electrical landing plug contacts. This results in shallower contact openings with reduced aspect ratios, and the single etch minimizes the risk of substrate damage that would otherwise occur during different contact etchings. This improves the reliability of making contacts on high-density circuits having submicron dimensions.

Figure 13:
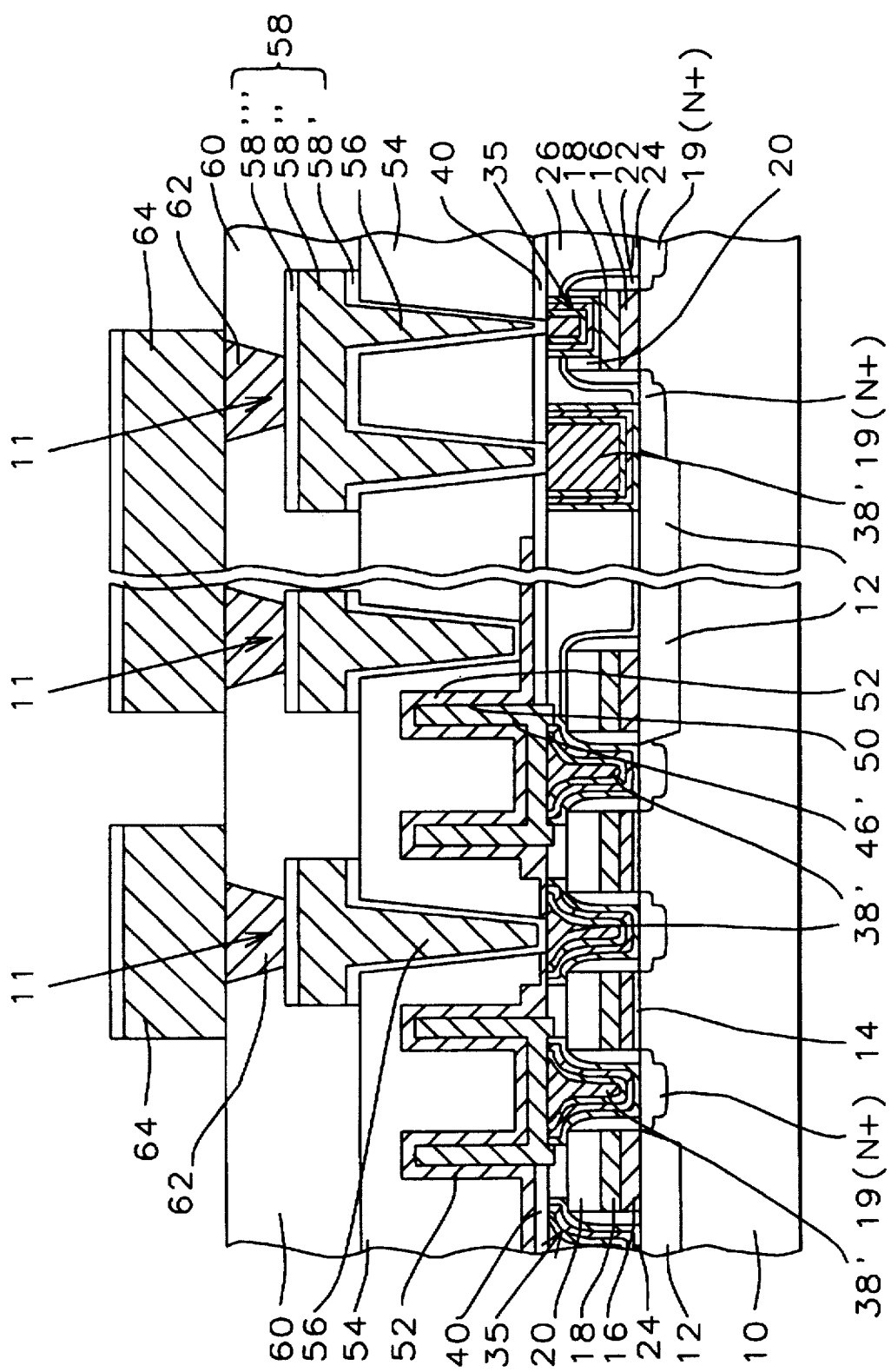

Referring now to FIG. 13, the DRAM circuit is completed up to the second level of metal interconnections. A fourth conducting layer 56 is deposited and etched back to form the conducting plugs 56 in the multilevel contact openings 7, 7', and 7". Layer 56 is preferably formed by depositing a Ti/TiN barrier layer and a tungsten layer. The Ti/TiN barrier layer is preferably deposited by chemical vapor deposition to a thickness of between about 100 and 800 Angstroms, and the tungsten is deposited by CVD using $WF_6$ to a thickness sufficient to fill the openings 7, 7', and 7", and more specifically to a thickness of between about 2000 and 5000 Angstroms. Layer 56 is then etched back or chemically/mechanically polished back to form the conducting plugs 56 in the multilevel contact openings 7, 7', and 7" having reduced aspect ratios.

Next, the first level of metal interconnections is formed by depositing a fifth conducting layer 58. Layer 58 is a multilayer, preferably composed of a barrier layer 58' such as Ti/TiN, a conducting layer 58" such as AlCu, and a top layer 58'" such as TiN. Layer 58' is deposited by physical vapor deposition or CVD to a thickness of between about 400 and 1500 Angstroms. The AlCu layer 58" is deposited to a thickness of between about 4000 and 8000 Angstroms. The TiN layer 58'" is deposited to a thickness of between about 200 and 1500 Angstroms. The multilayer 58 is then patterned by conventional photolithography and plasma etching to form the first level of metal inter-connections. As also shown in FIG. 13, a second level of metal interconnections can be formed similar to the first level of metal interconnections by depositing another insulating layer 60, such as CVD oxide, etching contact openings 11 and filling them with metal plugs 62, such as W, and depositing and patterning a second level of metal 64, such as Ti/AlCu/TiN.

While the invention has been particularly shown and described with reference to the preferred embodiment thereof, it will be understood by those skilled in the art that various changes in form and details may be made without departing from the spirit and scope of the invention.

What is claimed is:

1. A method for fabricating capacitor-under-bit line (CUB) dynamic random access memory (DRAM) devices comprising the steps of:

providing a semiconductor substrate having memory cell device areas and peripheral device areas, said device areas surrounded and electrically isolated from each other by field oxide regions, and further providing field effect transistors having gate electrodes, formed from a patterned polycide layer with an insulating cap layer, on said device areas, and said gate electrodes having insulating sidewall spacers and source/drain contact areas in said device areas adjacent to said gate electrodes;

depositing a conformal silicon nitride layer;

depositing and planarizing a first insulating layer;

selectively and anisotropically etching self-aligned contact openings in said first insulating layer and said silicon nitride layer to said source/drain contact areas of said memory cell device areas, and concurrently etching contact openings to said substrate in said peripheral device areas using a first photoresist mask;

removing said first photoresist mask;

using a second photoresist mask and selectively anisotropically etching contact openings in said first insulating layer and said silicon nitride layer to said patterned polycide layer in said peripheral device areas, while said second photoresist mask protects said memory cell device areas from etching;

removing said second photoresist mask;

depositing a conformal conductively doped polysilicon layer in said contact openings on said substrate;

depositing a conformal electrically conducting metal barrier layer and annealing to form a metal silicide with said conductively doped polysilicon layer to form contacts in said contact openings without depleting the dopant in said substrate that would otherwise increase contact resistance;

depositing a first conducting layer sufficient to fill said contact openings and etching back to said first insulating layer to form landing plug contacts;

depositing an etch-stop layer and a second insulating layer;

etching openings in said second insulating layer and said etch-stop layer to said landing plug contacts in said memory cell device areas for capacitors using a third photoresist mask, while protecting from etching said second insulating layer over said landing plug contacts for bit lines;

depositing a conformal second conducting layer for bottom electrodes of said capacitors;

depositing a third insulating layer to fill said openings for said capacitors and planarizing said third insulating layer;

etching back said third insulating layer and said second conducting layer to top surface of said second insulating layer, and selectively etching said second insulating layer to said etch-stop layer to form said bottom electrodes;

depositing an interelectrode dielectric layer;

depositing and patterning a third conducting layer to form top electrodes to complete said capacitors;

depositing a fourth insulating layer over said capacitors and polishing back to form a planar surface;

etching multilevel contact openings in said fourth insulating layer to said top electrodes, while concurrently etching multilevel contact openings to said landing plug contacts for said bit lines in said memory cell device areas, and concurrently etching openings to said landing plug contacts in said peripheral device areas;

depositing a fourth conducting layer to fill said multilevel contact openings, and etching back to form conducting plugs;

depositing a first metal layer and patterning to complete said DRAM devices to a first level of electrical interconnections.

2. The method of claim 1, wherein said first insulating layer is composed of silicon oxide and after planarizing has a thickness of between about 4500 and 9000 Angstroms over said gate electrodes.

3. The method of claim 1, wherein said electrically conducting barrier layer is formed by depositing consecutively an $N^+$ doped polysilicon layer, a titanium layer, and a titanium nitride layer, and said annealing is carried out at a temperature of between about 500 and 700° C. to form a titanium silicide layer, wherein said doped polysilicon layer prevents depletion of dopant from said substrate in said contact openings, thereby preventing increased contact resistance.

4. The method of claim 1, wherein said first conducting layer is tungsten deposited by chemical vapor deposition using tungsten hexafluoride.

5. The method of claim 1, wherein said etch-stop layer is silicon nitride deposited to a thickness of between about 100 and 500 Angstroms.

6. The method of claim 1, wherein said second insulating layer is silicon oxide deposited to a thickness of between about 10000 and 20000 Angstroms.

7. The method of claim 1, wherein said second conducting layer is a material selected from the group consisting of tungsten and titanium nitride, and is deposited to a thickness of between about 300 and 1000 Angstroms.

8. The method of claim 1, wherein said third insulating layer is chemical vapor deposited silicon oxide, and is planarized by chemical/mechanical polishing.

9. The method of claim 1, wherein said third insulating layer is a polymer, and is planarized by thermal annealing.

10. The method of claim 1, wherein said interelectrode dielectric layer is a material selected from the group consisting of tantalum pentoxide and barium strontium titanium oxide (BaSr)TiO$_3$.

11. The method of claim 1, wherein said third conducting layer is a material selected from the group consisting of tungsten and titanium nitride, and is deposited to a thickness of between about 500 and 1500 Angstroms.

12. The method of claim 1, wherein said fourth insulating layer is silicon oxide deposited by plasma-enhanced chemical vapor deposition and is planarized.

13. The method of claim 1, wherein said fourth conducting layer is formed by depositing consecutively a titanium layer, a titanium nitride layer, and a tungsten layer.

14. The method of claim 1, wherein said first metal layer is a multilayer formed by depositing sequentially titanium-titanium nitride/aluminum copper/titanium nitride layers.

15. A method for fabricating capacitor-under-bit line (CUB) dynamic random access memory (DRAM) devices comprising the steps of:

providing a semiconductor substrate having memory cell device areas and peripheral device areas, said device areas surrounded and electrically isolated from each other by field oxide regions, and further providing field effect transistors having gate electrodes, formed from a patterned polycide layer with an insulating cap layer, on said device areas, and said gate electrodes having insulating sidewall spacers and source/drain contact areas in said device areas adjacent to said gate electrodes;

depositing a conformal silicon nitride layer;

depositing and planarizing a first insulating layer;

selectively and anisotropically etching self-aligned contact openings in said first insulating layer and said silicon nitride layer to said source/drain contact areas of said memory cell device areas, and concurrently etching contact openings to said substrate in said peripheral device areas using a first photoresist mask;

removing said first photoresist mask;

using a second photoresist mask and selectively anisotropically etching contact openings in said first insulating layer and said silicon nitride layer to said patterned polycide layer in said peripheral device areas, while said second photoresist mask protects said memory cell device areas from etching;

removing said second photoresist mask;

depositing a conformal N$^+$ doped polysilicon layer in said contact openings on said substrate;

depositing a conformal titanium barrier layer and annealing to form a titanium silicide with said N$^+$ doped polysilicon layer to form contacts in said contact openings without depleting the dopant in said substrate that would otherwise increase contact resistance;

depositing a first conducting layer sufficient to fill said contact openings and etching back to said first insulating layer to form landing plug contacts;

depositing an etch-stop layer and a second insulating layer;

etching openings in said second insulating layer and said etch-stop layer to said landing plug contacts in said memory cell device areas for capacitors using a third photoresist mask, while protecting from etching said second insulating layer over said landing plug contacts for bit lines;

depositing a conformal second conducting layer for bottom electrodes of said capacitors;

depositing a third insulating layer to fill said openings for said capacitors and planarizing said third insulating layer;

etching back said third insulating layer and said second conducting layer to top surface of said second insulating layer, and selectively etching said second insulating layer to said etch-stop layer to form said bottom electrodes;

depositing an interelectrode dielectric layer;

depositing and patterning a third conducting layer to form top electrodes to complete said capacitors;

depositing a fourth insulating layer over said capacitors and polishing back to form a planar surface;

etching multilevel contact openings in said fourth insulating layer to said top electrodes, while concurrently etching multilevel contact openings to said landing plug contacts for said bit lines in said memory cell device areas, and concurrently etching openings to said landing plug contacts in said peripheral device areas;

depositing a fourth conducting layer to fill said multilevel contact openings, and etching back to form conducting plugs;

depositing a first metal layer and patterning to complete said DRAM devices to a first level of electrical interconnections.

16. The method of claim 15, wherein said first insulating layer is composed of silicon oxide and after planarizing has a thickness of between about 4500 and 9000 Angstroms over said gate electrodes.

17. The method of claim 15, wherein said N$^+$ doped polysilicon layer is deposited to a thickness of between about 100 and 300 Angstroms, and is doped with phosphorus to a concentration of between about 1.0 E 19 and 1.0 E 20 atoms/cm$^3$.

18. The method of claim 15, wherein said electrically conducting barrier layer is formed by depositing a titanium layer to a thickness of between about 50 and 200 Angstroms, and depositing a titanium nitride layer to a thickness of between about 100 and 300 Angstroms, and said annealing is at a temperature of between about 500 and 700° C. to form a titanium silicide layer.

19. The method of claim 15, wherein said first conducting layer is tungsten deposited by chemical vapor deposition using tungsten hexafluoride.

20. The method of claim 15, wherein said etch-stop layer is silicon nitride deposited to a thickness of between about 100 and 500 Angstroms.

21. The method of claim 15, wherein said second insulating layer is silicon oxide deposited to a thickness of between about 10000 and 20000 Angstroms.

22. The method of claim 15, wherein said second conducting layer is a material selected from the group consisting of tungsten and titanium nitride, and is deposited to a thickness of between about 300 and 1000 Angstroms.

23. The method of claim 15, wherein said third insulating layer is chemical vapor deposited silicon oxide, and is planarized by chemical/mechanical polishing.

24. The method of claim 15, wherein said third insulating layer is a polymer, and is planarized by thermal annealing.

25. The method of claim 15, wherein said inter-electrode dielectric layer is a material selected from the group consisting of tantalum pentoxide and barium strontium titanium oxide $(BaSr)TiO_3$.

26. The method of claim 15, wherein said third conducting layer is a material selected from the group consisting of tungsten and titanium nitride, and is deposited to a thickness of between about 500 and 1500 Angstroms.

27. The method of claim 15, wherein said fourth insulating layer is silicon oxide deposited by plasma-enhanced chemical vapor deposition and is planarized.

28. The method of claim 15, wherein said fourth conducting layer is formed by depositing consecutively a titanium layer, a titanium nitride layer, and a tungsten layer.

29. The method of claim 15, wherein said first metal layer is a multilayer formed by depositing sequentially titanium-titanium nitride/aluminum copper/titanium nitride layers.

* * * * *

UNITED STATES PATENT AND TRADEMARK OFFICE
CERTIFICATE OF CORRECTION

PATENT NO. : 5,893,734
DATED : 04/13/99
INVENTOR(S) : Erik S. Jeng, and Kwong-Jr Tsai It is certified that error appears in the above-identified patent and that said Letters Patent is hereby corrected as shown below:

On the title page: Item [75] delete "Kwong Tsai Jr.", and replace with --Kwong-Jr Tsai--.

Signed and Sealed this

Twelfth Day of October, 1999

Attest:

Q. TODD DICKINSON

Attesting Officer     Acting Commissioner of Patents and Trademarks